United States Patent [19]
Ainspan et al.

[11] Patent Number: 5,381,060
[45] Date of Patent: Jan. 10, 1995

[54] DIFFERENTIAL CURRENT SWITCH TO SUPER BUFFER LOGIC LEVEL TRANSLATOR

[75] Inventors: Herschel A. Ainspan, White Plains; John F. Ewen, Yorktown Heights, both of N.Y.

[73] Assignee: International Business Machines Corporation, Armonk, N.Y.

[21] Appl. No.: 837,461

[22] Filed: Feb. 14, 1992

[51] Int. Cl.$^6$ ............... H03K 19/0175; H03K 17/16
[52] U.S. Cl. ................................... 326/68; 326/21
[58] Field of Search ................. 307/475, 455, 443

[56] References Cited

U.S. PATENT DOCUMENTS

| | | | |
|---|---|---|---|
| 4,401,901 | 8/1983 | Ochi | 307/475 |
| 4,831,284 | 5/1989 | Anderson et al. | 307/450 |
| 4,849,659 | 7/1989 | West | 307/475 |
| 4,939,393 | 7/1990 | Petty | 307/475 |
| 4,978,871 | 12/1990 | Jordan | 307/475 |
| 5,153,465 | 10/1992 | Sandhu | 307/475 |

OTHER PUBLICATIONS

Nakamura, "A 390ps 1000-Gate Array Using GaAs Super-Buffer FET Logic", Feb. 14, 1985, Proc. IEEE ISSCC, pp. 204-205.
Ewen, "GB/S Fiber Optic Link Adapter Chip Set", IEEE GaAs IC Symposium, Nov. 6, 1988, pp. 11-14.

*Primary Examiner*—Edward P. Westin
*Assistant Examiner*—Richard Roseen
*Attorney, Agent, or Firm*—Blaney Harper; David Aker

[57] ABSTRACT

The present invention is a translator circuit which receives an input compatible with a differential current switch type of circuit and transmits an output compatible with a super buffer logic type of circuit. The translator circuit has a gain stage interposed between an input and output stage which both level shift the signal downward. The gain stage provides the translator circuit with the performance necessary to avoid attenuation of the signal between receiving the input signal and transmitting the output signal. The input and output stages buffer the gain stage by shifting the voltage level of the translator downward in two stages. The translator circuit provides its own voltage reference circuits which are compatible with the power supply of the DCS and SBL circuits. The reference circuits are self compensating for temperature effects. The translator circuit of the present invention allows different types of circuit families to be inexpensively designed on the same integrated circuit chip. Therefore, DCS type circuits can be used to implement high performance operations and SBL circuits can be used to implement complex logic circuits in an efficient design. The translator circuit is used in a light receiver, including a photodetector for converting a light signal into an electrical signal. The photodetector is coupled to an amplifier/bias circuit. The amplifier/bias circuit generates a differential signal input for a differential current switch circuit. The differential current switch circuit is connected to a super-buffer logic circuit through the translator circuit.

15 Claims, 4 Drawing Sheets

DIFFERENTIAL CURRENT SWITCH TO SUPER BUFFER LOGIC LEVEL TRANSLATOR

FIELD OF THE INVENTION

This invention relates generally to the field of semiconductor circuits. More particularly, this invention relates to a circuit for translating a current switch output to a logic level output. Specifically, this invention relates to translating a high performance differential current switch output level to an output level compatible with super-buffer digital logic.

BACKGROUND OF THE INVENTION

The use of optical communications promises to significantly enhance computing power. The use of a light based transmission media has significant performance advantages over conventional electrical communications. In order to take advantage of the enhanced rate of data transmission which can be transmitted by light based systems, data link components such as optical receivers and transmitters must process the data to be sent or received at ever increasing data rates. Even though the transmitter or receiver must process the data faster, parts of the transmitter or receiver must also provide increased logical function for a unit of chip area. Therefore, the data link in optical communications must not only process data faster but it must also have increased functional capability. The requirement of increased performance is typically met by implementing some functions of the data link in a differential current switch (DCS) family of circuits. This is because the DCS family of circuits offers increased speed and better rejection of power supply noise than other circuit families. The requirement of increased functional capability is typically met by implementing some functions of the data link in a super buffer logic (SBL) or direct coupled logic (DCFL) family. This is because the SBL or DCFL family of circuits offer a compact and flexible design capability with low power dissipation.

The DCS family of circuits combines a gain stage with a push-pull output stage in order to create a logical block which has high power supply noise rejection and uses a power supply which is common to other circuit families. The DCS designs have a 0.7 volt signal swing referenced to the applicable power supply, here a 3.6 volt CMOS compatible supply. As a result of this design base, the DCS family of circuits is very efficient in terms of active device area and performance for implementing certain types of functions, such as, latches, exclusive ORs, and multiplexers among others. This same design base makes the DCS family inefficient at implementing other functions such as multiple input ANDs, or NORs. However, the SBL family of circuits uses an active load to reduce the propagation delay of the circuits while maintaining a minimum number of devices for any logical function. The SBL designs also have a 0.7 volt signal swing but it is reference to ground (0 volts). This design base makes SBL efficient at implementing ANDs and NORs but inefficient at implementing latches and multiplexers. The data link requires both types of functions. As a result, it would be desirable to combine both types of circuits in a single design. The problem with this is that the input/output voltage levels of the DCS circuit family do not match the input/output voltage levels of the SBL circuit family. This means that the two families of circuits cannot directly send data to each other.

OBJECTS OF THE INVENTION

It is an object of the present invention to manufacture a high performance optical data link.

It is a further object of the present invention to manufacture a high performance optical data link having increased functionality.

It is still another object of the present invention to manufacture a high performance optical data link using multiple circuit design techniques.

It is still a further object of the present invention to manufacture a high performance optical data link having an interface between differential current switch type circuits and super buffer logic type circuits.

SUMMARY OF THE INVENTION

The present invention is a translator circuit which receives an input compatible with a differential current switch type of circuit and transmits an output compatible with a super buffer logic type of circuit. The translator circuit has a gain stage interposed between an input and output stage which both level shifts the signal downward, and amplifies the signal, to offset the attenuation in the input and output stages. The input and output stages buffer the gain stage by shifting the voltage level of the translator downward in two stages. The translator circuit provides its own voltage reference circuits which are compatible with the power supply of the DCS and SBL circuits. The reference circuits are self compensating for temperature effects. The translator circuit of the present invention allows different types of circuit families to be inexpensively designed on the same integrated circuit chip. Therefore, DCS type circuits can be used to implement high performance operations and SBL circuits can be used to implement complex logic circuits in an efficient circuit design. This type of integration is important for many applications and it is especially important for optical data networks in which many optical data links are manufactured with integrated designs.

DESCRIPTION OF THE PREFERRED EMBODIMENT

Figure 1:
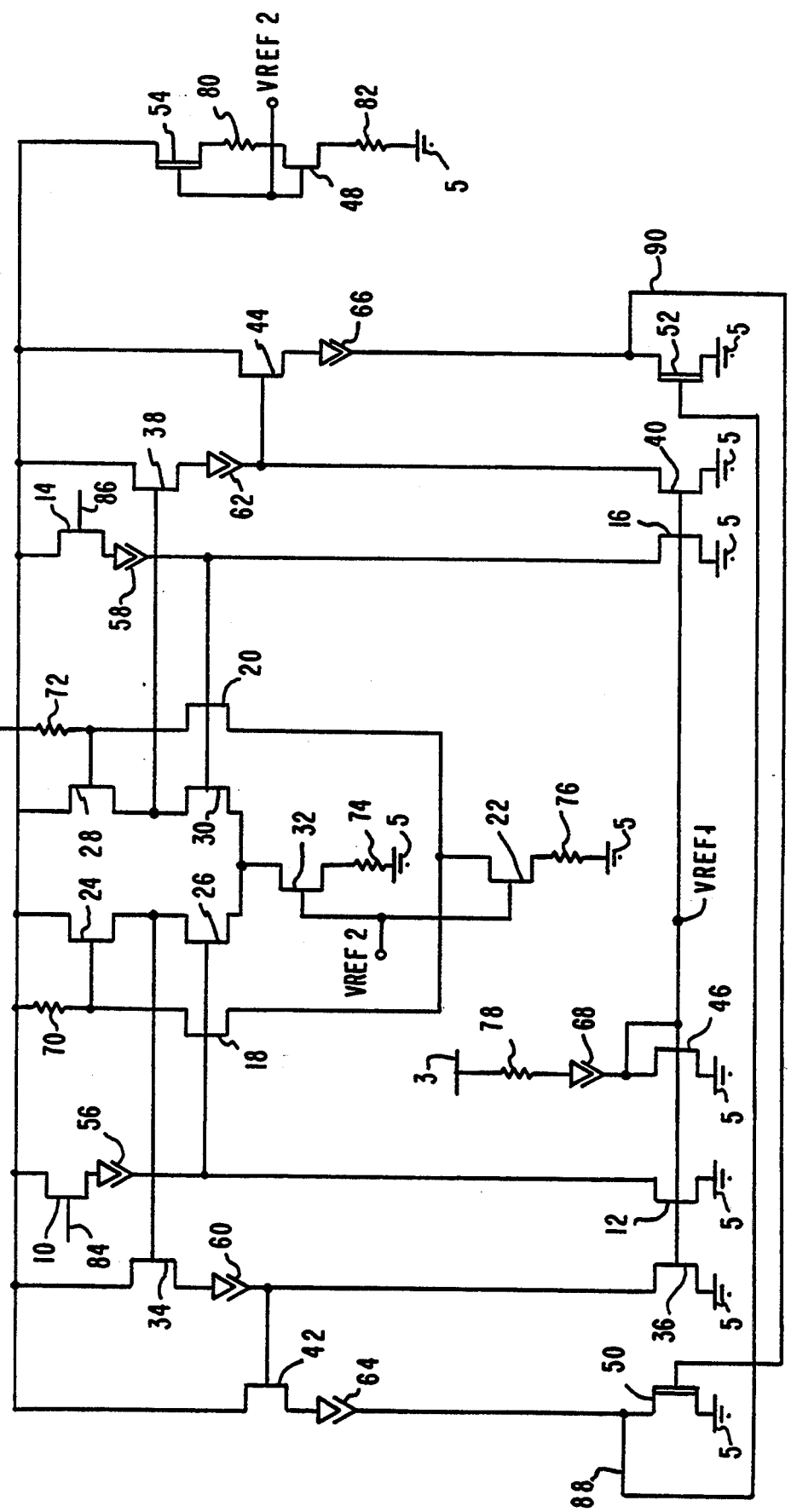
FIG. 1 illustrates a circuit schematic of the present invention.

FIG. 1 illustrates the present invention. The present invention is a translator circuit for translating the output voltages of a differential current source (DCS) type of circuit to voltage levels compatible with the input of a super buffer logic (SBL) type of circuit. This translator circuit has two power supplies, 3 and 4, and ground 5. Power supply 3 is at 1.4 volts and power supply 4 is at 3.6 volts.

Transistor 10 is an enhancement mode device with a width to length ratio (W/L) of 10. The drain of transistor 10 is connected to power supply 4 and the source is connected to the positive side of the diode 56. The gate of device 10 is the positive input to the translator circuit which is the positive output of the DCS circuit. The negative side of diode 56 is connected to the drain of the enhancement type transistor 12. Transistor 12 has a W/L ratio of 10. The source of transistor 12 is connected to the ground 5. The gate of transistor 12 is connected to the first voltage reference VREF1.

Transistors 10, 12 and diode 56 form a first source follower (SF) which level shifts the positive input to the gain stage of the translator circuit down by approximately 1.1 volts. The 1.1 volts is the sum of the Schottky diode drop of 0.7 V and the Vgs of 0.4 V on device 10, which is set by the Vgs of device 12. The input to the translator circuit is a differential signal because it is the output of a DCS circuit. The positive (or negative) input is a relative term to refer to the greater (or lesser) voltage level of the differential signal input. A second source follower circuit also level shifts the negative input to the translator circuit down by approximately 1.1 volts. The second SF is similar to the first SF, and is formed from enhancement devices 14 and 16 and diode 58. The drain of device 14 is connected to the power supply 4, the source is connected to the positive side of the diode 58, and the gate is the negative input 86 of the translator circuit. Further, device 16 has its drain connected to the negative side of diode 58, the source connected to ground 5, and the gate connected to VREF1.

The output of the first SF is the negative side of the diode 56, and the output of the second SF is the negative side of the diode 58. The outputs of the SFs are the inputs to the gain stage of the translator circuit. The gain stage consists of enhancement transistors 18, 20, 22, 24, 26, 28, 30, and 32. The drain of transistor 18 is connected to the power supply 4 through a resistor 70. The W/L ratio of transistor 18 is 10 and the value of resistor 70 is 2.7k Ohms. The gate of transistor 18 is connected to the output of the first SF stage. The source of transistor 18 is connected to the drain of transistor 22. The source of transistor 22 is connected to ground 5 through resistor 76. The W/L ratio of transistor 22 is 10 and the value of resistor 76 is 0.4k Ohms. The gate of transistor 22 is connected to VREF2. The drain of transistor 22 is also connected to the source of transistor 20. The gate of transistor 20 is connected to the output of the second SF. The drain of transistor 20 is connected to the power supply 4 through resistor 72. The W/L ratio of transistor 20 is 10 and the value of resistor 72 is 2.7k Ohms.

The drain of transistor 20 is also connected to the gate of transistor 28. The source of transistor 28 is connected to the drain of transistor 30 and the drain of transistor 28 is connected to the power supply 4. The W/L ratio of transistor 28 is 7. The gate of transistor 30 is connected to the output of the second SF stage and the source of transistor 30 is connected to the drain of transistor 32. The W/L ratio of transistor 30 is 10. Transistor 32 has its gate connected to VREF2 and its source connected to ground through resistor 74. The W/L ratio of transistor 32 is 16 and the value of the resistor 74 is 0.275k Ohms. The source of transistor 30 is also connected to the source of transistor 26. Transistor 26 has its gate connected to the output of the first SF stage. The drain of transistor 26 is connected to the source of transistor 24. The W/L ratio of transistor 26 is 10. The gate of transistor 24 is connected to the drain of transistor 18 and the drain of transistor 24 is connected to the power supply 4.

Transistors 24, 26, 28, 30, and 32 form a first current tree in which current flows. Current flows through transistor 32 independent of the inputs received into the translator circuit. Transistors 24 and 26 form a first branch of the tree and when the positive input to the translator circuit 84 is "high", current flows through the first branch of the current tree. Similarly, when the negative input to the translator circuit 86 is high, current flows through a second branch of the current tree formed by transistors 28 and 30. VREF2 controls the amount of current in the tree at any one time because it is the gate voltage of transistor 32. Transistors 18, 20, and 22 form a second current tree in which current flows. VREF2 also controls the amount of current flowing in the second current tree because it is the gate voltage to transistor 22. When the positive input 84 is "high", current flows through resistor 70 and transistor 18. When the negative input 86 is "high", current flows through resistor 72 and transistor 20.

The outputs of the gain stage are buffered with respect to the outputs of the translator circuit. The first output of the gain stage is the voltage at the drain of transistor 26. The drain of transistor 26 is attached to the gate of transistor 34. The drain of transistor 34 is connected to power supply 4 and the source is connected to the positive side of diode 60. The negative side of diode 60 is then connected to the drain of transistor 36 and the gate of enhancement mode transistor 42. Transistor 36 has its source connected to ground 5 and its gate connected to VREF1. The W/L ratio of the enhancement mode transistors 34 and 36 is 5. The drain of transistor 42 is connected to the power supply 4 and the source is connected to the positive side of diode 64. The negative side of diode 64 is connected to the drain of the depletion mode transistor 50. The gate of transistor 50 is connected to the positive output of translator circuit 90 and the source is connected to ground 5. The W/L ratio of transistor 42 is 9 and the W/L ratio of transistor 50 is 3.

The second output of the gain stage of the translator circuit is also buffered in a similar manner to the first output. The second output of the gain stage is the voltage at the drain of transistor 30. The drain of transistor 30 is connected to the gate of enhancement mode transistor 38. Transistor 38 has its drain connected to power supply 4 and its source connected to the positive side of diode 62. The negative side of diode 62 is connected to the drain of enhancement mode transistor 40 and the gate of enhancement mode transistor 44. The gate of transistor 40 is connected to VREF1 and the source is connected to ground 5. The W/L ratio of transistors 38 and 40 is 5. The drain of transistor 44 is connected to the power supply 4 and the source is connected to the positive side of diode 66. The negative side of diode 66 is connected to the drain of depletion mode transistor 52. The W/L ratio of transistor 44 is 9 and the W/L ratio of transistor 52 is 3. The drain of depletion mode transitor 52 is the positive output 90 of the translator circuit. The source of transistor 52 is connected to ground and the gate is connected to the negative output 88 of the translator circuit. The outputs of the translator circuit 88 and 90 are cross coupled to the gates of depletion mode devices 52 and 50 respectively.

VREF1, which controls the current in the input level shifting and the output buffer of the translator circuit, is generated from transistor 46, diode 68, resistor 78, and power supply 3. Power supply 3 is 1.4 volts and is connected to the positive side of diode 68 through resistor 78. The value of resistor 78 is 2.1k Ohms. The negative side of diode 68 is connected to the drain and the gate of enhancement mode transistor 46. The source of transistor 46 is connected to ground 5 and the W/L ratio of transistor 46 is 10. VREF1 is the voltage at the gate of transistor 46. VREF2 controls the current in the gain stage current trees. VREF2 is generated from depletion mode transistor 54, enhancement mode transistor 48, and resistors 80 and 82. Power supply 4 is connected to the drain of transistor 54. The gate of transistor 54 is connected to the gate and drain of transistor 48. The source of transistor 54 is connected to the drain of transistor 48 through resistor 80. The source of transistor 48 is connected to ground through resistor 82. The value of resistor 80 is 0.7k Ohms and the value of resistor 82 is 0.825k Ohms. The W/L ratio of transistor 54 is 31.5 and the W/L ratio of transistor 48 is 16.5. VREF2 is the voltage at the gates of transistors 54 and 48.

Figure 2:
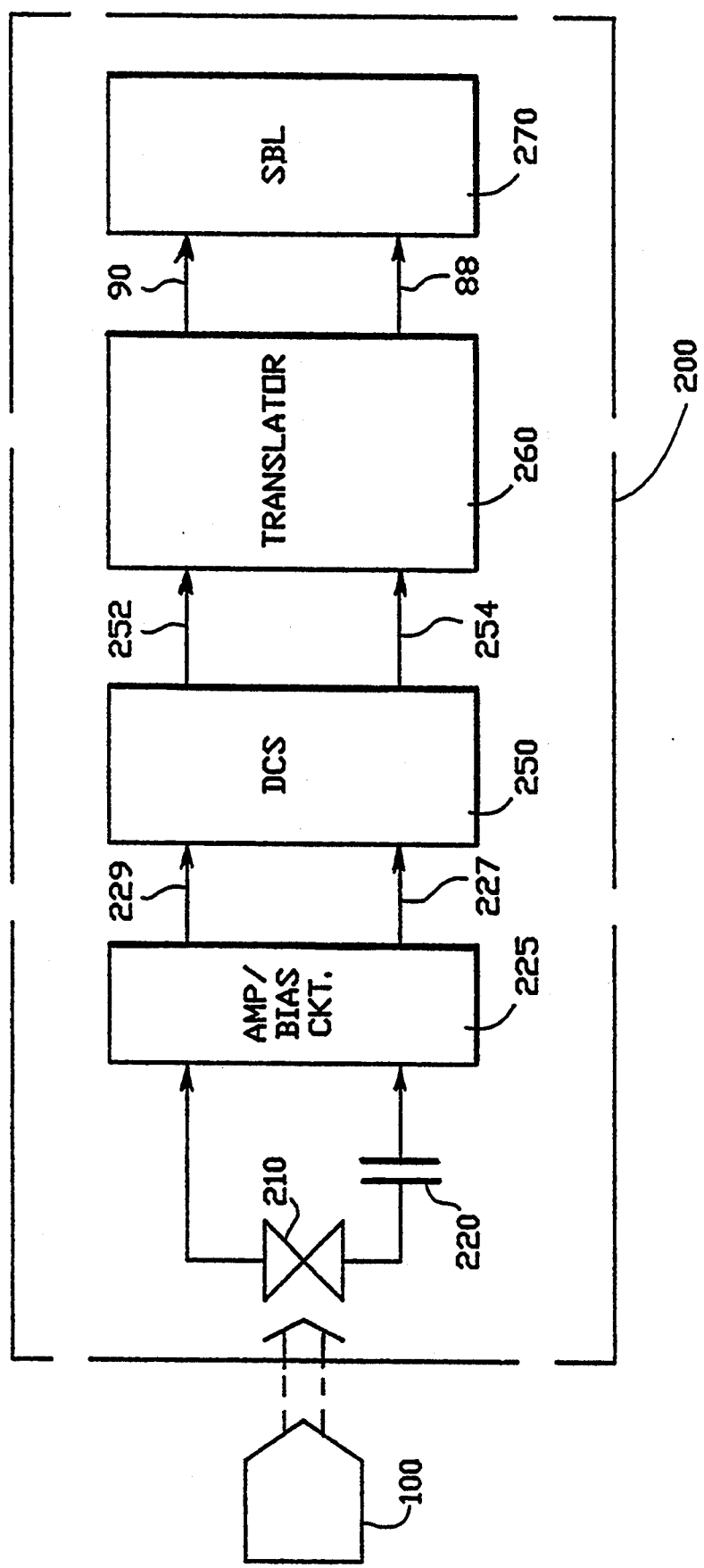
FIG. 2 illustrates a block diagram of an optical receiver implemented using the translator circuit of the present invention.

FIG. 2 illustrates an optical receiver implementing the translator circuit. An optical transmitter such as a laser or fiber optic cable transmits light to the receiver chip 200. The optical receiver is fabricated in a gallium arsenide field effect transistor (FET) process which is well known in the field of integrated circuit processing. The transmitted light is received by a photodetector 210. The photodetector is a conventional metal-semiconductor-metal (MSM) photodetector fabricated on a gallium arsenide receiver chip 200. The MSM photodetector has interlocking and interdigitated fingers of a metal alloy as the diode contacts deposited on gallium arsenide. The interdigitated design improves the efficiency of the photodetector. These types of photodetectors are well known in the art and a variety of different designs function equally well in this implementation of the invention. The output of the photodetector 210 is coupled to amplifier/bias circuitry 225 through capacitor 220. The value of the capacitor depends on the desired performance of the receiver and is a choice well known to those of skill in the art. A typical capacitor value is in the range of approximately $1 \times 10^{-12}$ to $1 \times 10^{-11}$ farads but could be considerably more. The amplifier/bias circuitry 225 generates a differential signal from the photodetector signal which becomes an input to the DCS circuitry 250. The signal differential between input 227 and 229 generated by amplifier/bias circuitry 225 is approximately constant. The DCS circuitry 250 consists of a variety of circuits including amplifiers, multiplexers, and latches depending on the function performed by any one particular receiver. The true output 252 and its complement 254 of the DCS circuitry are input to the translator circuit 260. The outputs 88 and 90 of the translator circuit 260 are then transmitted to the SBL circuits 270.

Figure 3:
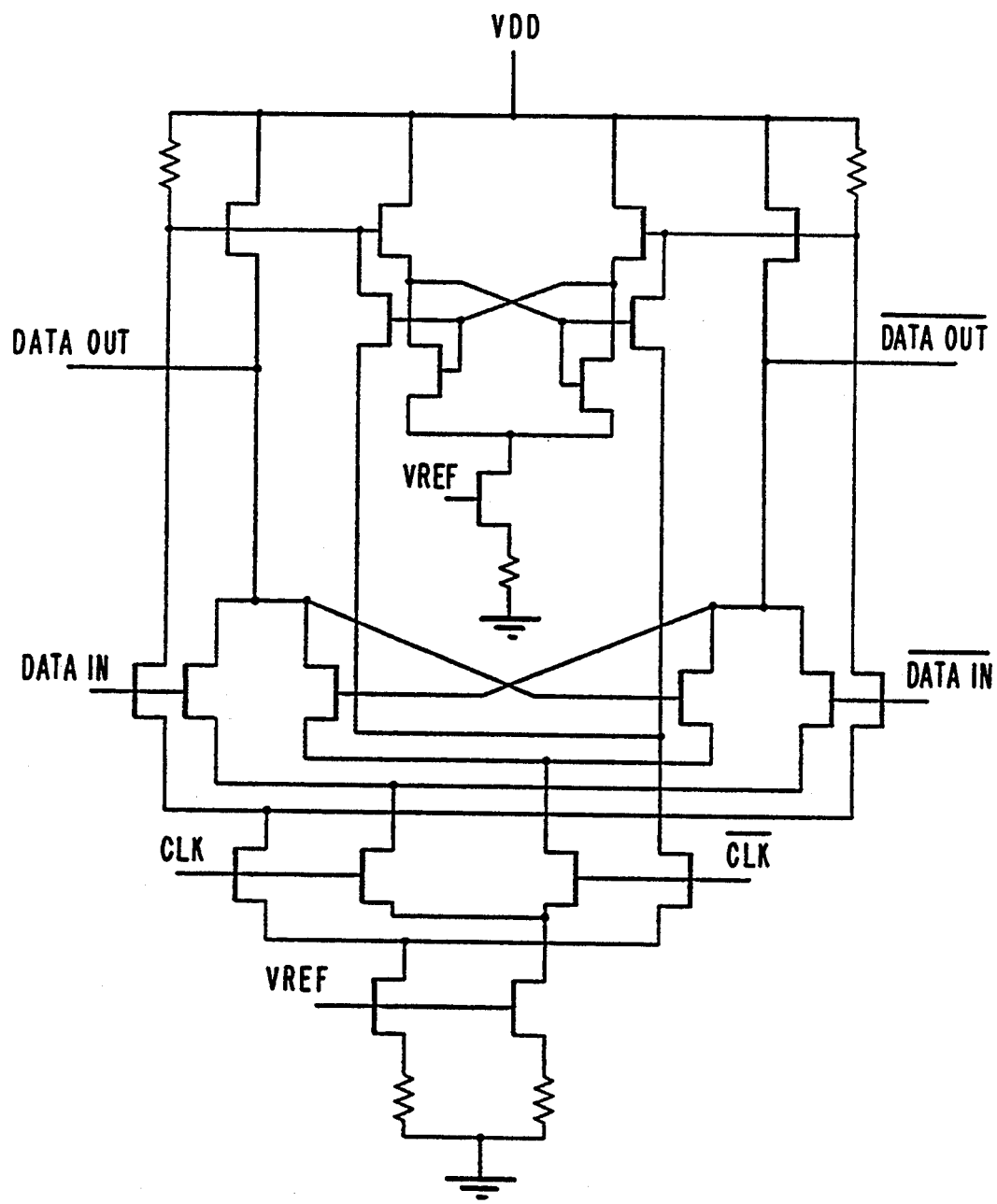
FIG. 3 illustrates a circuit schematic of the input circuit to the present invention.
Figure 4:
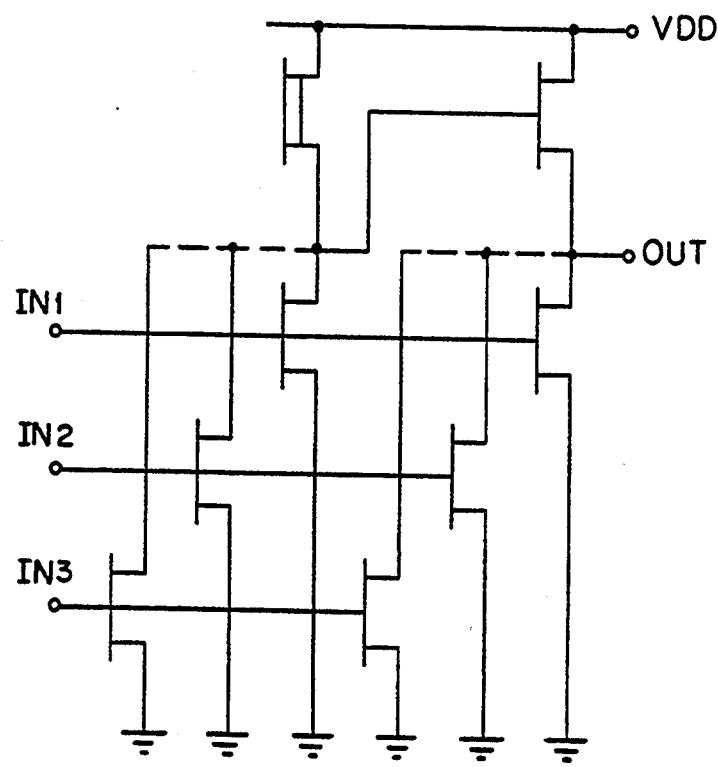
FIG. 4 illustrates a circuit schematic of the output circuit for the present invention.

An example of a DCS type of latch is shown in FIG. 3. The data (and its complement) are clocked into the latch and the true data out (and the data out complement) are also clocked out of the latch. The voltages on the output of the DCS latch are referenced to Vdd which is 3.6 volts in this case. The maximum signal swing is approximately 1.2 volts which means that any output signal level will be at least approximately 2.4 volts. An example of an SBL type of circuit is shown in FIG. 4. The power supply of this circuit is approximately 1.4 volts. As a result, the high logic level of the SBL circuit must be less than 1.4 volts because the high logic level cannot be greater than the power supply.

Therefore, an output of the DCS circuits cannot be directly inputted to the SBL circuits because the SBL circuit cannot detect the signal swings above 1.4 volts and DCS type circuits have output levels which are at least 2.4 volts.

The true data output 252 of the DCS circuit 250 is connected to the true data input 84 of the translator circuit 260. The complement of the true data output 254 of the DCS circuit 250 is connected to the complement data input 86 of the translator circuit 260. The first source follower level shifts the voltage down 1.1 volts from the input level. The source follower circuit requires diode 56 because the gallium arsenide FET technology imposes a Schottky diode across the gate-source of the enhancement mode FETs. This Schottky diode clamps the gate-source voltage at 0.7 volts. Therefore, to get a further drop in the level shifting, an extra diode 56 is added to the source follower. This same solution to the Schottky gate-source clamp is applied to the second source follower with diode 58 being added to the second source follower.

The first and second source-followers are each biased with reference voltage VREF1. VREF1 controls the source-followers because the source followers are saturated FETs in series. Current in each source-follower is equal to $K(Vgs-Vt)^2$. The current in each FET connected in series is identical. Assuming that K and Vt are the same, due to lock tracking of device parameters, then Vgs must track from the lower transistor to the upper transistor in the source follower. Therefore, the value of VREF1 will be mirrored in the upper FET of each source-follower. It is important that VREF1 is mirrored in the upper FETs of each source-follower because the added diodes to the source-followers have positive temperature coefficients. That is, as the temperature of the diode rises, the current flow in the diode rises. The rise in current flow produces a drop in the voltage across the diode, and as a result, less downward level shifting from the source-follower as temperature rises. The VREF1 circuit generates VREF1 such that VREF1 has a negative Temperature coefficient. As temperature increases, diode 68 has a lower voltage drop (because of its positive temperature coefficient) which raises VREF1. VREF1 then rises with temperature and is reflected in the upper transistor of the source-followers to counter the temperature effect which lowers voltage on the diodes 56 and 58 of the source-followers.

The outputs of the first and second source-followers are connected to the inputs of the gain stage current trees. The outputs of the current trees are the sources of transistors 24 and 28. The signal swing at these nodes is limited to the difference between the power supply and the voltage at the common sources of transistors 26 and 30. The downward level shifting of the first and second source-followers sets a lower voltage at this common-source node and provides a larger signal swing at the outputs of the current trees. The bias current in the current trees is controlled by VREF2. VREF2 is generated by the voltage divider circuit consisting of depletion mode transistor 54, enhancement transistor 48, and resistors 80 and 82. The gate-source voltage of transistor 48 is clamped by the Schottky diode inherent in the FET technology used in this embodiment. Additionally, the gate-drain voltage is zero by design and so the transistor 48 behaves like a diode. Therefore, VREF2 is controlled by the relative values of the resistors 80 and 82.

VREF2 is controlled so that transistors 22 and 32 are in saturation. The relative amounts of current flowing through transistors 22 and 32 depend simply on the relative W/L ratios of transistors 22 and 32. The current which flows through transistor 32 also flows through either transistors 24 and 26 or transistors 28 and 30. When the true input to the gain stage is high, the current flows through transistors 24 and 26. When the true input is low, the current flows through transistors 28 and 30. When the true input is low transistors 18 and 26 are both turned off. When transistor 18 is off, no current flows through resistor 70 leaving the voltage at the gate of transistor 24 to be at the power supply level. When the true input makes the transition from low to high, transistor 18 turns on and current flows through resistor 70. The gate voltage of transistor 24 decreases but is still high enough to turn on transistor 24. Transistor 24 is, in effect, always turned on and so does not need to be charged up when switching between logic states. This effect improves the speed of the logic circuit. The lower gate bias of transistor 24 when the true input is high also improves the output signal swing.

The voltage swing in the gain stage is limited by the difference in voltage between the power supply voltage and the voltage at the common sources of transistors 26 and 30. The difference is increased by operating transistor 24 in its non-saturated region and lowering the gate-source voltage. The resistor 70 operates to bias transistor 24 out of saturation but still conducting enough current to switch the logic states quickly. Transistor 28 and resistor 72 behave in a similar manner to transistor 24 and resistor 70.

The true and complement outputs of the gain stage are the voltages at the drains of transistors 30 and 26 respectively. These voltages wing between 1.6 and 3.4 volts. The outputs of the gain stage are each connected to a separate output buffer which each consist of two source-follower stages. These four source-follower stages are separate from the two input source-follower stages. The true output of the gain stage is connected to transistor 38 which is part of one source-follower stage. Transistors 38 and 40 and diode 62 form this third source-follower. The fourth source follower formed from transistors 44 and 52 and diode 66. The third source-follower level shifts the output from the gain stage down 1.0 volt. The fourth source-follower level shifts the output of the third source-follower down another 0.4 volts. The third source-follower uses VREF1 as the compensation to counteract the negative temperature coefficient of the voltage across diode 62. The fourth source-follower stage cannot use the voltage mirror of VREF1 because the bottom FET comes out of saturation when the drain to source voltage drops to a few millivolts. Instead, the fourth source-follower uses a depletion mode device 52 cross coupled to the source followers connected to the complement output of the gain stage.

The fifth and sixth source-followers mirror the functions provided by the third and fourth source-followers only the fifth and sixth source-followers are connected to the complement output of the gain stage. The sixth source-follower uses a depletion mode device cross coupled to the fourth source follower. The sixth source-follower cannot use VREF1 for the same reason as the fourth source-follower. The cross-coupled pulldown depletion-mode transistors provide faster rise and fall times compared to a fixed pulldown device such as a resistor or transistor at constant gate-source voltage.

When node 90 goes low, node 88 goes high and increases the gate-source voltage on transistor 52. This increases the drain current of transistor 52, which discharges the load capacitance of the next circuit more quickly. When node 90 goes high, node 88 goes low and reduces the drain current of transistor 52. Thus more of the current from transistor 44 can be used to charge up the load capacitance. If transistor 52 were a fixed current sink (resistor or transistor) then some of the current from transistor 44 would be drawn off by the current sink and the load capacitance would be charged up more slowly, reducing the overall speed of the circuit.

Figure 5:
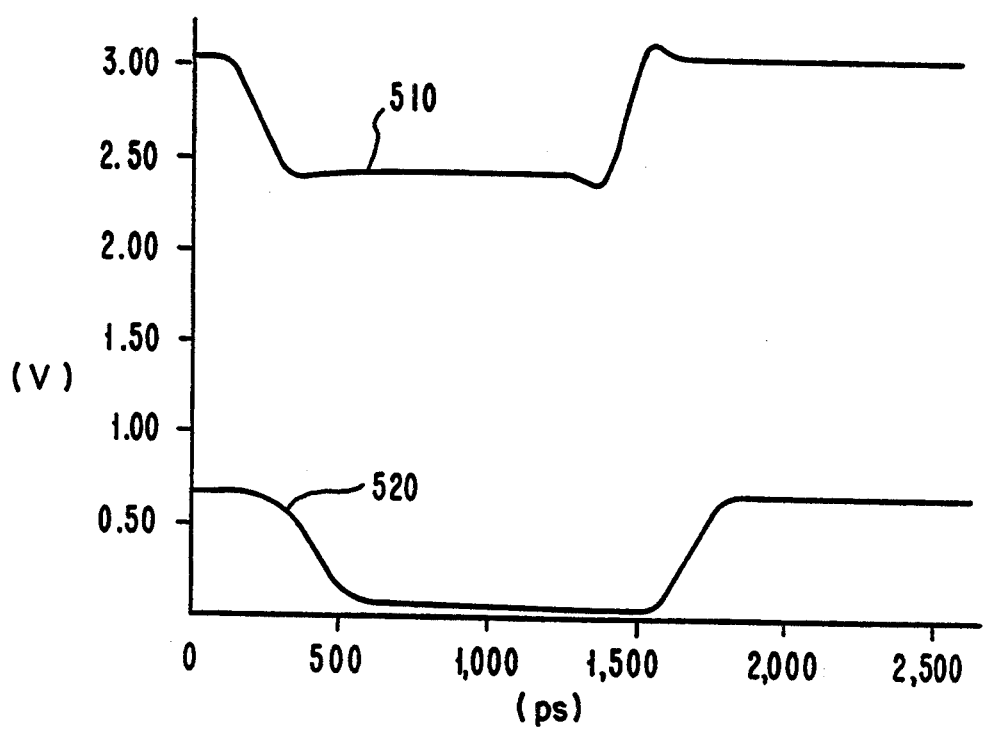
FIG. 5 illustrates the input and output voltage as a function of time for the present invention.

The drains of the depletion mode devices 88 and 90 are the outputs of the translator circuit. FIG. 5 illustrates the electrical response of the translator circuit. The waveform 510 is the input waveform to the true input 84 of the translator circuit 260. The waveform 520 is the true output 90 of the translator circuit 260. FIG. 5 plots the voltage on the nodes 84 and 90 versus time for a translator circuit 260 having an output 90 loaded with an SBL inverter circuit. When the input to the translator circuit is high (approximately 3.0 volts), the output is high at approximately 0.7 volts. A transition from high to low requires approximately 100 picoseconds for the translator circuit to start to respond. The transition from high to low takes approximately 200 ps. The low level on the input 84 is approximately 2.4 volts and the low level on the output 90 is approximately 0 volts. A transition from low to high takes approximately 200 ps and has a delay in the response of approximately 100 ps.

While this invention has been described with respect to a particular preferred embodiment, it would be understood by those skilled in the art that changes in the above description or illustrations may be made with respect to form or detail without departing from the spirit or scope of the invention.

Having thus described our invention what we claim as new and desire to secure as Letters Patent, is:

1. A translator circuit comprising:
   an input stage for receiving a first and second input having a first minimum voltage level of 2.4 volts, said input stage shifts said first and second inputs to a lower voltage level than said first minimum voltage level;
   said input stage having an output connected to a gain stage, said gain stage transmits an enhanced signal from said input stage to an output stage, said enhanced signal having a voltage level greater than a second minimum voltage level of 1.6 volts;
   said output stage shifts said enhanced signal to a voltage level lower than said second minimum voltage level.

2. A translator circuit, comprising:
   an input stage for receiving a first and second input having a first minimum voltage level, said input stage shifts said first and second inputs to a lower voltage level than said first minimum voltage level;
   said input stage having an output connected to a gain stage, said gain stage transmits an enhanced signal from said input stage to an output stage, said enhanced signal having a voltage level greater than a second minimum voltage level;
   said output stage shifts said enhanced signal to a voltage level lower than said second minimum voltage level;

wherein: said input stage comprises a level shifting source follower means and a first voltage reference circuit;

said sourced follower means having a diode connected in series between a first and a second transistor, said first transistor receiving one of said first and second inputs to said input stage, said connection between said diode and said second transistor connected to said gain stage; and said second transistor having a gate connected to said first voltage reference circuit wherein said first voltage reference circuit provides a voltage which tracks a voltage drop across said diode.

3. A translator circuit, as in claim 2, wherein:
said first minimum voltage level is 2.4 volts; and
said second minimum voltage level is 1.6 volts.

4. A translator circuit, comprising:
an input stage for receiving a first and second input having a first minimum voltage level, said input stage shifts said first and second inputs to a lower voltage level than said fist minimum voltage level;

said input stage having an output connected to a gain stage, said gain stage transmits an enhanced signal from said input stage to an output stage, said enhanced signal having a voltage level greater than a second minimum voltage level;

said output stage shifts said enhanced signal to a voltage level lower than said second minimum voltage level;

wherein: said output stage comprises at least two source followers, a first source follower connected to a true output of said gain stage and a second source follower connected to a complement output of said gain stage;

said first and second output source followers each having a depletion mode device, each depletion mode device having a source connected to ground, said first output source follower depletion mode device having a gate connected to a drain of said second output source follower depletion mode device; and said first output source follower depletion mode device having a drain connected to a gate of said second output source follower depletion mode device, each of said drains being connected to a respective output of the source followers of said output stage.

5. A translator circuit, as in claim 4, wherein:
said first minimum voltage level is 2.4 volts; and
said second minimum voltage level is 1.6 volts.

6. A translator circuit, comprising:
an input stage for receiving a first and second input having a first minimum voltage level, said input stage shifts said first and second inputs to a lower voltage level than said first minimum voltage level;

said input stage having an output connected to a gain stage, said gain stage transmits an enhanced signal from said input stage to an output stage, said enhanced signal having a voltage level greater than a second minimum voltage level;

said output stage shifts said enhanced signal to a voltage level lower than said second minimum voltage level; wherein: said first minimum voltage level is 2.4 volts and said second minimum voltage level is 1.6 volts;

said input stage comprises a level shifting source follower means and a first voltage reference circuit;

said source follower means having a diode connected in series between a first and a second transistor, said first transistor receiving one of said first and second inputs to said input stage, said connection between said diode and said second transistor connected to said gain stage; and said second transistor having a gate connected to said first voltage reference circuit wherein said first voltage reference circuit provides a voltage which tracks a voltage drop across said said output stage comprises at least two source followers, a first source follower connected to a true output of said gain stage and a second source follower connected to a complement output of said gain stage;

said first and second output source followers each having a depletion mode device, each depletion mode device having a source connected to ground, said first output source follower depletion mode device having a gate connected to a drain of said second output source follower depletion mode device; and said first output source follower depletion mode device having a drain connected to a gate of said second output source follower depletion mode device, each of said drains being connected to a respective output of the source followers of said output stage.

7. A translator circuit, as in claim 1, wherein:
said input stage comprises two source followers, a first source follower receives said first input and a second source follower receives said second input;

said first source follower having two transistors and a diode connected in series between a power supply and ground, a first transistor of said first source follower having a source connected to a positive connection on said diode, a drain connected to said power supply, and a gate connected to said first input;

said diode having a negative side connected to a drain of said second transistor of said first source follower; said gate of said second transistor connected to a first voltage reference circuit, and a source of said second transistor connected to ground;

said second source follower having two transistors and a diode connected in series between a power supply and ground, a first transistor of said second source follower having a source connected to a positive connection on said diode, a drain connected to said power supply, and a gate connected to said second input;

said diode having a negative side connected to a drain of said second transistor of said second source follower; said gate of said second transistor connected to a first voltage reference circuit, and a source of said second transistor connected to ground;

said gain stage comprises two current trees connected in parallel between said power supply and ground;

a first current tree having a first bias transistor drain connected to said power supply through a bias resistor, said first bias transistor source connected to a second bias transistor source, said second bias transistor having a drain connected to said power supply through a second bias resistor, said first and second bias transistor sources connected to a first reference transistor drain, said first reference transistor having a source connected to ground through a first reference resistor, said first reference transistor having a gate connected to a second voltage reference circuit wherein said second voltage reference circuit maintains a constant total current in said first current tree;

said second current tree having a drain of a first sense transistor connected to said power supply through a first load transistor, said first load transistor having a drain connected to said power supply and a source connected to said drain of said first sense transistor;

said second current tree having a drain of a second sense transistor connected to said power supply through a second load transistor, said second load transistor having a drain connected to said power supply and a source connected to said drain of said second sense transistor;

said first sense transistor having a source connected a source of said second sense transistor, said first and second sense transistor sources connected to a drain of a second reference transistor, said second reference transistor having a source connected to ground through a second reference resistor, said second reference transistor having a gate connected to a second voltage reference circuit wherein said second voltage reference circuit maintains a constant total current in said second current tree; and said first bias resistor of said first current tree connected to a gate of said first load transistor of said second current tree and said second bias resistor of said first current tree connected to a gate of said second load transistor of said second current tree wherein said connections between said load transistors and bias resistors maintain operation of said load transistors out of the saturation mode.

8. A light receiver, comprising:

a photodetector for converting a light signal into an electrical signal;

said photodetector coupled to a amplifier/bias circuit through a capacitor, said amplifier/bias circuit generates a differential signal input for a differential current switch circuit connected to said amplifier/bias circuit;

said differential current switch circuit connected to a super-buffer logic circuit through a translator circuit, said differential current switch circuit having a true and a complement output, said true output connected to one input of said translator circuit and said complement output connected to a second input of said translator circuit.

9. A light receiver, as in claim 8, wherein said translator circuit comprises:

an input stage for receiving a first and second input having a first minimum voltage level, said input stage shifts said first and second inputs to a lower voltage level than said first minimum voltage level;

said input stage having an output connected to a gain stage, said gain stage transmits an enhanced signal from said input stage to an output stage, said enhanced signal having a voltage level greater than a second minimum voltage level;

said output stage shifts said enhanced signal to a voltage level lower than said second minimum voltage level.

10. A light receiver, as in claim 9, wherein:
said first minimum voltage level is 2.4 volts; and
said second minimum voltage level is 1.6 volts.

11. A light receiver, as in claim 9, wherein:

said input stage comprises a level shifting source follower means and a first voltage reference circuit;

said source follower means having a diode connected in series between a first and a second transistor, said first transistor receiving one of said first and second inputs to said input stage, said connection between said diode and said second transistor connected to said gain stage; and said second transistor having a gate connected to said first voltage reference circuit wherein said first voltage reference circuit provides a voltage which tracks a voltage drop across said diode.

12. A light receiver, as in claim 11, wherein:
said first minimum voltage level is 2.4 volts; and
said second minimum voltage level is 1.6 volts.

13. A light receiver, as in claim 9, wherein:

said output stage comprises at least two source followers, a first source follower connected to a true output of said gain stage and a second source follower connected to a complement output of said gain stage;

said first and second output source followers each having a depletion mode device, each depletion mode device having a source connected to ground, said first output source follower depletion mode device having a gate connected to a drain of said second output source follower depletion mode device; and said first output source follower depletion mode device having a drain connected to a gate of said second output source follower depletion mode device, each of said drains being connected to a respective output of the source followers of said output stage.

14. A light receiver, as in claim 13, wherein:
said first minimum voltage level is 2.4 volts; and
said second minimum voltage level is 1.6 volts.

15. A light receiver, as in claim 9, wherein:
said first minimum voltage level is 2.4 volts and said second minimum voltage level is 1.6 volts;

said input stage comprises a level shifting source follower means and a first voltage reference circuit;

said source follower means having a diode connected in series between a first and a second transistor, said first transistor receiving one of said first and second inputs to said input stage, said connection between said diode and said second transistor connected to said gain stage;

said second transistor having a gate connected to said first voltage reference circuit wherein said first voltage reference circuit provides a voltage which tracks a voltage drop across said diode;

said output stage comprises at least two source followers, a first source follower connected to a true output of said gain stage and a second source follower connected to a complement output of said gain stage;

said first and second output source followers each having a depletion mode device, each depletion mode device having a source connected to ground, said first output source follower depletion mode device having a gate connected to a drain of said second output source follower depletion mode device; and said first output source follower depletion mode device having a drain connected to a gate of said second output source follower depletion mode device, each of said drains being connected to a respective output of the source followers of said output stage.

* * * * *